United States Patent [19]

Seidler

[11] 4,120,558

[45] Oct. 17, 1978

[54] SOLDER BEARING TERMINAL

[75] Inventor: Jack Seidler, New Rochelle, N.Y.

[73] Assignee: North American Specialties Corporation, Flushing, N.Y.

[21] Appl. No.: 824,441

[22] Filed: Aug. 15, 1977

[51] Int. Cl.[2] .......................................... H01R 11/06
[52] U.S. Cl. ................................................ 339/275 T
[58] Field of Search .......... 339/17 LC, 275 R, 275 B, 339/275 T

[56] References Cited

U.S. PATENT DOCUMENTS

| 3,351,704 | 11/1967 | Sitzler | 339/275 T |
| 4,019,803 | 4/1977 | Schell | 339/275 B |

FOREIGN PATENT DOCUMENTS 2,321,828  11/1973  Fed. Rep. of Germany ...... 339/17 LC Primary Examiner—Joseph H. McGlynn
Attorney, Agent, or Firm—DeLio and Montgomery

[57] ABSTRACT

A terminal clip for attachment to a contact pad on a substrate having an individual mass of solder mechanically engaged with the clip in a position to be melted for bonding the clip to the contact pad.

4 Claims, 15 Drawing Figures

U.S. Patent   Oct. 17, 1978   Sheet 1 of 2   4,120,558
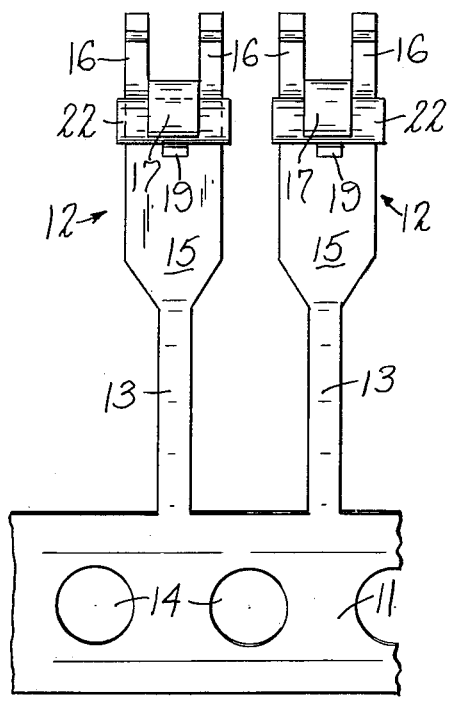
Fig. 1.
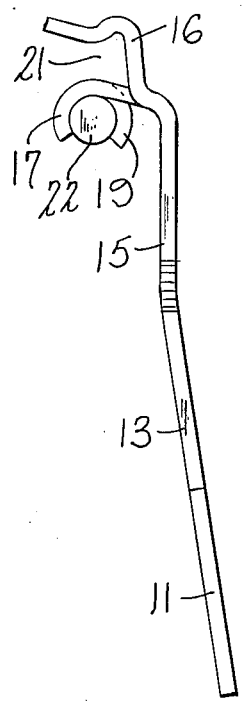
Fig. 2.
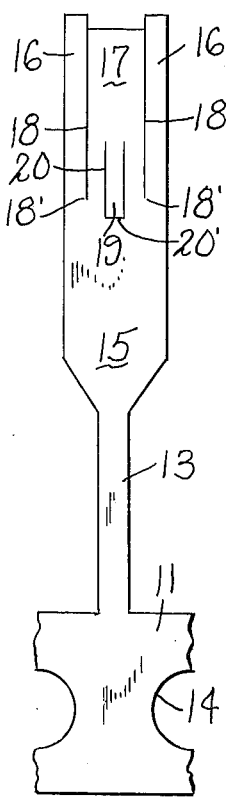
Fig. 4.
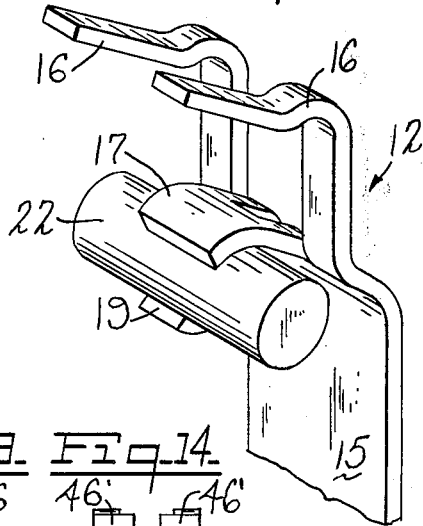
Fig. 3.
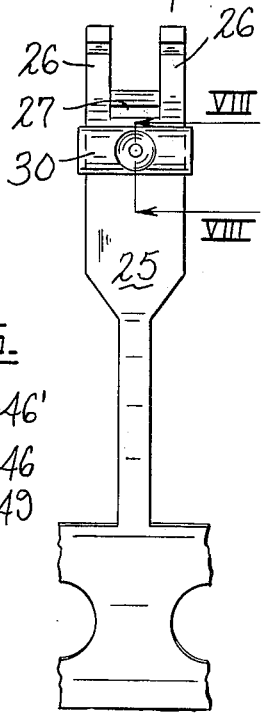
Fig. 5.
Fig. 15.
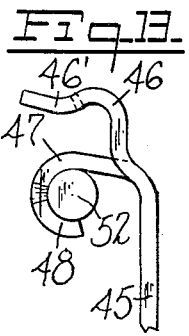
Fig. 13.
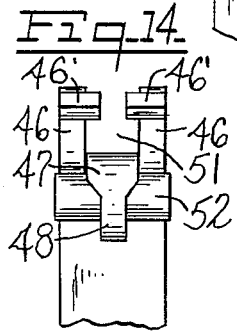
Fig. 14.
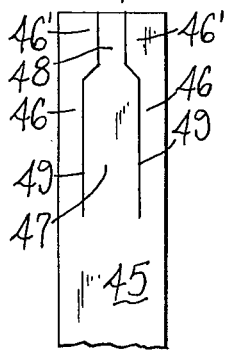

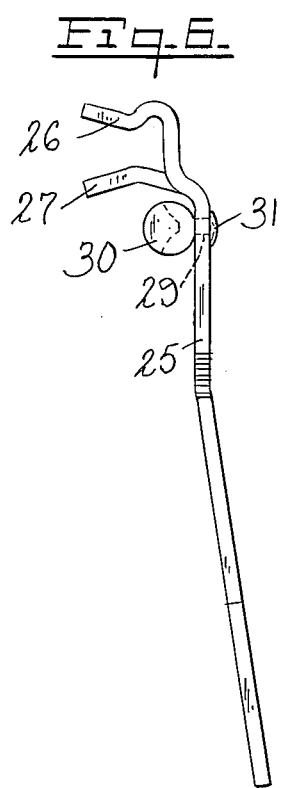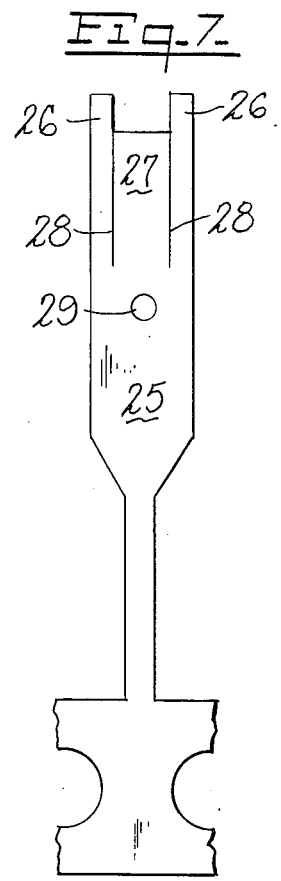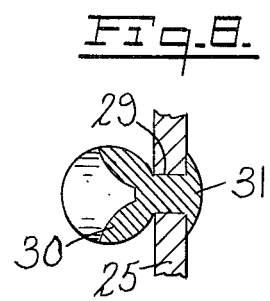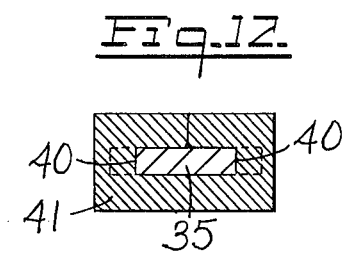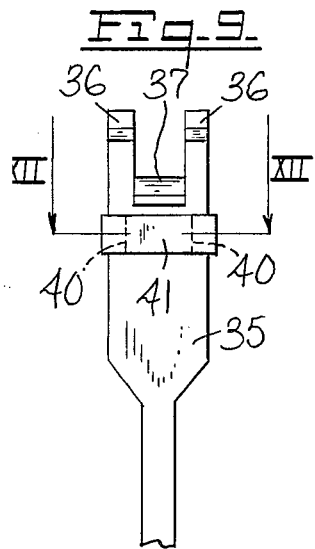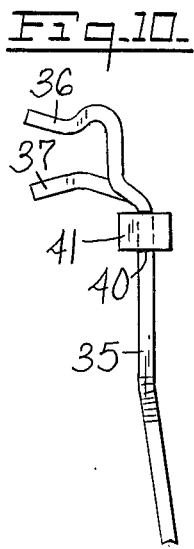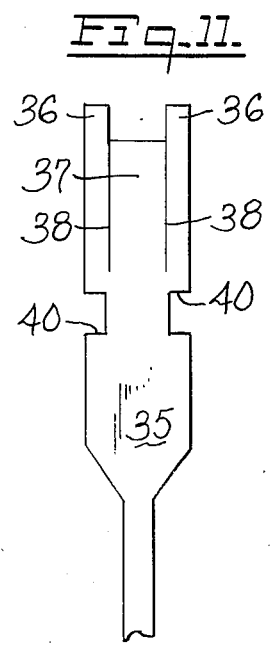

SOLDER BEARING TERMINAL

This invention relates to a solder bearing terminal clip for attachment to a contact pad on a substrate wherein the solder is mechanically engaged with the clip in a position to be melted for bonding the clip to the contact pad.

Various means have been provided wherein a quantity of solder is associated with a terminal clip so that when the clip has been positioned on a contact pad (usually a metal surface on a substrate introduced into the jaws of the clip) and the assembly is heated, the molten solder covers the adjacent surfaces of the clip and pad to form, when cool, a soldered metallurgical joint between the clip and pad. Clips of this general type are shown in Cox et al. U.S. Pat. No. 3,689,684 wherein the pads are pre-tinned; Landman U.S. Pat. No. 3,750,252 wherein a continuous solder wire extends along a strip of clips and is held by a bent back clip arm; and Schell U.S. Pat. No. 4,019,803 wherein an individual solder mass is soldered to a clip arm on the side opposite the contact surface with a solder globule extending across one or both edges of the arm to the adjacent contact surface.

It is an object of the present invention to provide means for attaching securely a solder mass to a terminal clip in a purely mechanical manner.

It is a further object of the invention to provide a solder bearing clip wherein each clip has its own supply of solder in a convenient location for melting to form a bond with a pad.

It is another object of the invention to provide a solder and clip assembly which can be made by very simple and efficient stamping steps.

It is a still further object of the invention to provide certain improvements in the form, construction and arrangement of the parts whereby the above named and other objects may effectively be attained.

The invention accordingly comprises an article of manufacture possessing the features, properties, and the relation of elements which will be exemplified in the article hereinafter described, and the scope of the invention will be indicated in the claims.

Practical embodiments of the invention are shown in the accompanying drawings wherein:

FIG. 1 represents an elevation of a pair of clips on a carrier strip;

FIG. 2 represents a side view of a clip according to FIG. 1;

FIG. 3 represents a detail perspective view of the clip fingers, on an enlarged scale;

FIG. 4 represents a plan view of the blank as stamped to produce a clip according to FIGS. 1 to 3;

FIG. 5 represents an elevation of a first modified form of clip;

FIG. 6 represents a side view of the clip shown in FIG. 5;

FIG. 7 represents a plan view of the blank as stamped to produce a clip according to FIGS. 5 and 6;

FIG. 8 represents a detail section on the line VIII—VIII of FIG. 5;

FIG. 9 represents a detail elevation of the head of a second modified form of clip;

FIG. 10 represents a side view of the clip shown in FIG. 9;

FIG. 11 represents a detail plan view of the blank as stamped to produce the clip of FIGS. 9 and 10, FIG. 12 represents a section on the line XII—XII of FIG. 9;

FIG. 13 represents a side view of the head of a third modified form of clip;

FIG. 14 represents a front elevation of the clip shown in FIG. 13, and

FIG. 15 represents a plan view of the blank as stamped to produce the clip according to FIGS. 13 and 14.

Referring to the drawings, and particularly to FIGS. 1 to 4, the solder terminal strip includes a continuous carrier strip 11 with individual terminal clips 12 connected thereto by legs 13. The carrier strip may be provided with pilot holes 14 at regular intervals, as is customary.

Each clip includes a flat body portion 15, a pair of spring fingers 16, bent to extend upwardly and laterally from the plane of the body portion distally of the clip and spaced apart by the width of a central spring finger 17 which extends laterally in a position spaced from and substantially parallel to the fingers 16, defining a gap 21 adapted to receive the edge of a substrate (not shown). The fingers 16 and 17 are formed from the blank shown in FIG. 4 by the parallel cuts 18 which terminate at end points 18'. An additional gripping finger 19 is provided by the U-shaped cut 20, the sides of which lie parallel to the cuts 18 and the closed end 20' being below the line of the ends 18', this finger thus being formed partially from the material in the central finger 17. The free end of the finger 17 is curved arcuately away from the finger 16, and the gripping finger 19 is curved arcuately toward the curved end of finger 17, in a position to grip securely the short cylindrical slug of solder 22, as clearly shown in FIGS. 1, 2 and 3.

The terminal clip just described, or an array of several such terminal clips, is applied to the edge of a substrate having one or several contact pads, with the finger 17 resting against the pad (the assembly being inverted) and heat is supplied to melt the solder, which flows around the fingers 17 and 19 and bonds the clip securely to the substrate with a good electrical contact. The solder, in this clip and each clip described below, is held on the side of the gap nearer to the body portion.

Referring to FIGS. 5 to 8, the first modified form of clip is shown as having a flat body portion 25, a pair of spring fingers 26 (like fingers 16) and a central spring finger 27 (like finger 17), said fingers being formed from the blank shown in FIG. 7 by the parallel cuts 28. At a central point below the ends of the cuts 28 the body portion is provided with a hole 29 and a cylindrical slug of solder 30 is riveted into said hole by means of a punch having a suitably formed tapering tip (e.g. conical) adapted to force a portion of the solder material through the hole to be mushroomed against a slightly hollowed anvil face or the like into the profile shown at 31 in FIG. 8. The application of such a clip to a contact pad on a substrate is effected in the same manner as described above.

The second modified form of clip shown in FIGS. 9 to 12 includes the body portion 35, a pair of spring fingers 36, and a central spring finger 37 (like the fingers 26 and 27, respectively) formed by parallel cuts 38 in the blank shown in FIG. 11. Just below the ends of the cuts, the body portion is provided with notches 40 in each edge and a band of solder 41 is wrapped tightly around the body in a position to fit at least partially within the notches, as shown in FIGS. 9 and 12. The deformable and non-resilient character of lead solder is such that the band 41 stays in place until it is melted to bond the fingers 36 and/or 37 to the pad of a substrate, introduced between the fingers. The band of solder should be at least long enough to wrap around the edge of the base portion within each notch, and may completely encircle the base portion, as shown.

The third modified form of clip, shown in FIGS. 13 to 15, comprises the body portion 45, a pair of spring fingers 46 and a central spring finger 47, the latter finger having a narrow extension 48. When the fingers 46 and 47 are bent into position corresponding to those of the fingers 16 and 17, for instance, defining a gap 51 (like gap 21) the extension 48 can be bent arcuately to cooperate with finger 47 in embracing a short cylindrical slug of solder 52 (like solder 22). In order to form the finger 47 and extension 48 the blank is cut at 49 as shown in FIG. 15, leaving the fingers 46 with wide pads 46' adjacent their free ends, such pads increasing the strength, stability and conductive characteristics of the clip.

In each of the clips described above the solder slug, in the form of a bar or band is in firm mechanical engagement with the clip fingers or body, in a position to be melted for the formation of a bond between the fingers and terminal pad or the like. Each clip also can be made by simple stamping and assembling steps, with minimal waste of material.

It will thus be seen that the objects set forth above, among those made apparent from the preceding description, are efficiently attained and, since certain changes may be made in the above article without departing from the spirit and scope of the invention, it is intended that all matter contained in the above description and shown in the accompanying drawing shall be interpreted as illustrative and not in a limiting sense.

What I claim is:

1. A terminal clip for securement to a contact pad on a substrate comprising a clip body portion, a plurality of contact fingers projecting from an end of the body portion and bent to define a gap adapted to receive the edge of a substrate, and a cylindrical mass of solder, said fingers including a pair of fingers spaced laterally apart and located distally of the clip and a central finger having a width corresponding substantially to the distance between said spaced fingers, said central finger including means adapted to extend at least 180° around said cylindrical mass of solder for holding said mass of solder in a position adjacent said gap and on the side thereof nearer the clip body portion, at least a portion of said means being narrower than the central finger.

2. A terminal clip according to claim 1 wherein the solder holding means comprises an additional finger stamped partially from said central finger and curved toward said central finger in a position to grip the solder between said additional finger and said central finger.

3. A terminal clip according to claim 1 which includes an extension on the end of the central finger, said extension being bent around the mass of solder.

4. A terminal clip according to claim 3 wherein the extension is narrower than the central finger and the spaced fingers include wide pads adjacent their free ends.

* * * * *